United States Patent [19]

Hartmann et al.

[11] 4,024,570
[45] May 17, 1977

[54] SIMPLIFIED HOUSING STRUCTURE INCLUDING A HEAT SINK FOR A SEMICONDUCTOR UNIT

[75] Inventors: Gunter Hartmann; Joachim-Ullrich Schwarz; Klaus Keil, all of Munich, Germany

[73] Assignee: Siemens Aktiengesellschaft, Berlin & Munich, Germany

[22] Filed: Sept. 5, 1975

[21] Appl. No.: 610,757

[30] Foreign Application Priority Data

Sept. 17, 1974 Germany .......................... 2444418

[52] U.S. Cl. .................................. 357/81; 357/70; 357/71; 357/74; 357/72
[51] Int. Cl.² .................. H01L 23/02; H01L 23/48; H01L 29/46; H01L 29/54
[58] Field of Search ................. 357/70, 71, 72, 74, 357/81; 174/52 PE

[56] References Cited

UNITED STATES PATENTS

| 3,544,857 | 12/1970 | Byrne et al. | 357/74 |
| 3,610,870 | 10/1971 | Sakamoto | 357/72 |
| 3,662,230 | 5/1972 | Redwantz | 357/74 |
| 3,724,068 | 4/1973 | Galli | 357/74 |
| 3,820,153 | 6/1974 | Quinn | 357/81 |
| 3,825,803 | 7/1974 | Budde | 357/72 |
| 3,864,728 | 4/1975 | Peltz et al. | 357/71 |
| 3,868,725 | 2/1975 | Degraaf | 357/72 |
| 3,938,177 | 2/1976 | Hansen et al. | 357/70 |

*Primary Examiner*—Andrew J. James
*Attorney, Agent, or Firm*—Hill, Gross, Simpson, Van Santen, Steadman, Chiara & Simpson

[57] ABSTRACT

A plastic housing structure, for a semiconductor component or integrated circuit, employing a metallic heat conducting member forming a base plate of the housing, the conductor members for electrical connection of the semiconductor component extending from the latter to the base plate and insulated therefrom by a plastic film, with the housing being suitable for reception of semiconductor components of integrated circuits and mounting thereof into conductor boards or layer circuits.

11 Claims, 3 Drawing Figures

SIMPLIFIED HOUSING STRUCTURE INCLUDING A HEAT SINK FOR A SEMICONDUCTOR UNIT

BACKGROUND OF THE INVENTION

The invention relates to a housing structure for a semiconductor unit, which may be in the form of a semiconductor component element, an integrated circuit, or the like, which is particularly adapted for insertion into a layer-type circuit or a conductor board, in which the unit is disposed on a metal base plate of good heat conductivity, with electrical connections making contact with raised contact members or pads on the semiconductor unit by means of plastic foils which are provided with individual metal films. The side of the base plate carrying the semiconductor unit is covered by a mass or drop of plastic which encases the semiconductor unit and the adjacent side of the base plate.

It is already known in the art to dispose a semiconductor component element or an integrated circuit in a plastic housing, for example, as illustrated in U.S. Pat. No. 3,864,728, wherein the contact members or pads of the semiconductor component or integrated circuit are disposed in opposing relation with respect to the supporting structure to which the device is to be incorporated, with the electrical connections employing metal films connecting the raised contact pads of the semiconductor, which films are bent transversely to provide an offset structure which due to its configuration will not exert undesirably great shear stresses between the contact pads of the semiconductor and the metal film as a result of heat-induced expansion of the metal film. In this prior arrangement the plastic housing structure does not include any means for conductively removing heat generated in the semiconductor.

It is also known in the art, for example U.S. Pat. No. 3,743,895, to provide a metal semiconductor housing structure which includes a base or bottom plate also constructed of metal, whereby waste heat generated in the semiconductor may be dissipated through direct conduction therefrom by means of the bottom plate. Such type of metal housing, however, has the disadvantage that it is relatively expensive to manufacture, as the electrical connecting lines to the semiconductor are extended through the base plate and therefore must be insulated therefrom.

BRIEF SUMMARY OF THE INVENTION

The invention has as its objective the production of a housing for a semiconductor component element or an integrated circuit which includes a member of good heat conductivity to provide effective heat removal, and which at the same time may be readily constructed for use with layer circuits or conductor boards, and which is capable of manufacture in a relatively simple manner and at a relatively low cost.

This problem is solved, in accordance with the invention, by the utilization of metallic films which are supported upon a base plate of good heat conductivity by means of a plastic film. The housing in accordance with the invention thus incorporates a cooling member for the semiconductor unit in the form of a base plate with the electrical connecting lines being insulated from the base plate by a plastic film. The entire semiconductor unit and adjacent portions of the base plate may then be encased in a protective plastic mass.

BRIEF DESCRIPTION OF THE DRAWINGS

In the drawings wherein like reference characters indicate like or corresponding parts.

DETAILED DESCRIPTION OF THE INVENTION

Figure 1:
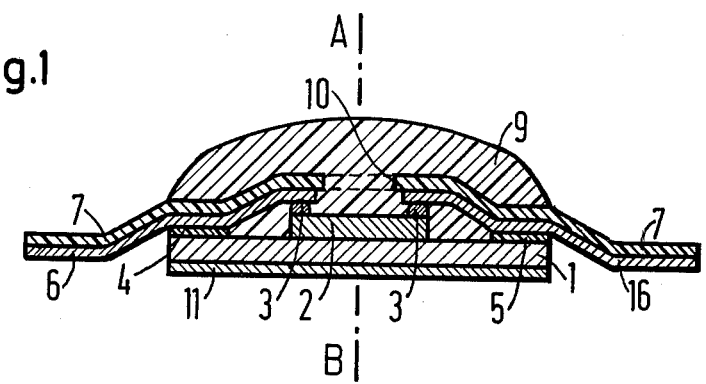
FIG. 1 is a transverse sectional view through a housing structure embodying the present invention, illustrating the details of the electrical connections, etc.

Referring to FIG. 1, disposed on a base plate 1 of copper is a semiconductor member 2, which may be alloyed, soldered or glued to the base plate. The semiconductor member 2 may comprise a semiconductor component element or an integrated circuit.

Disposed on the semiconductor member 2 are respective contact members or pads 3 connected to respective elements of the semiconductor component element or the integrated circuit, which contact pads are illustrated as being disposed at the top face of the semiconductor and may consist of a suitable metal, such as gold. Also disposed on the plate 1 are plastic films 4 and 5, which may be so-called "hot glue foils", and which are glued to the base plate 1 at opposite sides of the semiconductor 2. Electrical connections are made to the respective contact pads 3 by means of metal films 6, 16 which are carried by a plastic foil 7, the metal films 6 and 16, for example, being evaporated upon the plastic foil 7. The plastic foil 7 will be provided with a number of metal films 6, 16, etc. corresponding to the number of contact pads 3 of the semiconductor member 2. As will be apparent from reference to FIGS. 1 and 2, the plastic foil 7 is provided with an opening 10 therein directly above the semiconductor member 2, and finally the latter and the adjacent face of the base plate 1 are covered with a plastic mass or drop 9, whereby the semiconductor member and the associated contacting metal films are encased by the base plate 1 and the cooperable plastic mass 9.

Figure 2:
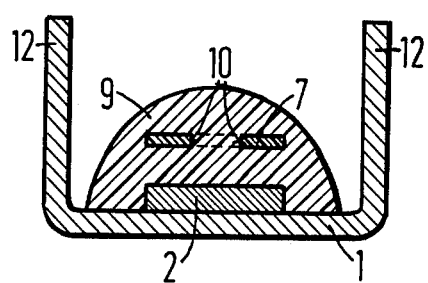
FIG. 2 is a sectional view taken on a line corresponding approximately to the line A-B of FIG. 1 and illustrating the additional provision of cooling wings.

The base plate 1 thus may serve as a heat conducting member whereby the semiconductor may be cooled, as a result of the conduction of heat therefrom through the directly connected base plate 1, which thus also forms a part of the housing. To provide additional heat dissipation, the base plate 1, as illustrated in FIG. 2, may be provided with additional cooling fins or wings 12, thereby providing additional heat exchange surface. It will be apparent from the above that the described housing is suitable for inclusion into both layer and conductor-board circuits without change in the basic construction of the housing.

The metal films 6, 16 may comprise tinned copper and, in lieu of the use of evaporation process, they may also be formed from a metal film initially applied upon the entire surface of the cooperable plastic film 7 and subsequently etched in correspondence to the desired physical configuration. The securement of the plastic films 5 and the metal films 6, 16 can be effected by means of heat, for example, suitable heat impulses.

Advantageously, the base plate 1 may be produced from a strip of metal having applied thereto continuous plastic films disposed adjacent the strip margin, which will later form the plastic films 4 and 5 following severance of the individual base plates from the strip. The semiconductor member is disposed upon the metallic strip and is subsequently connected therewith by means of gluing, alloying or soldering. A strip of plastic film, carrying the metal films 6, 16 is then disposed adjacent and at a right angle to the metallic strip and following connection of the metal films 6, 16 with the contact pad 3, for example by impulse soldering, and following connection of the metal films 6 and 16 with the plastic films 5 by means of the heat impulse, the individual foil 7 is severed from the strip thereof. The plastic mass 9, for example in the form of a drop, is then applied to the strip and adjacent structure to encase the respective elements, following which the individual plates 1 are severed from the strip stock from which they are formed.

In the event the complete semiconductor structure is to be employed in layer-type circuits, the base plate 1 may be provided with a coating of film 11 of tin or suitable solder alloy on its exposed lower face whereby the housing structure may be mounted into a layer circuit by a soldering operation or the like.

In the event the structure is to be inserted in a conductor board, the base plate 1 may be suitably punched out to provide one or more connection pins 17, 18 and 19, by means of which an electrical as well as mechanical connection may be effected with such a circuit board.

Figure 3:
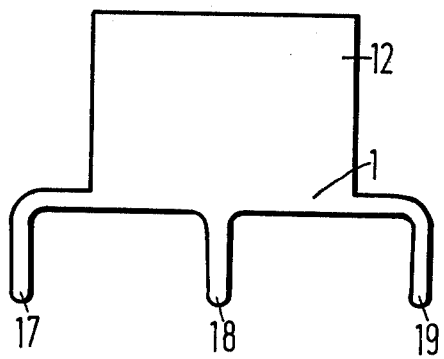
FIG. 3 is a side view of a housing, similar to that illustrated in FIG. 2, and which is additionally provided with connection pins.

As illustrated in FIG. 3 the plate 1 may be provided with both the connection tins and the wings 12, both of which may be produced by suitable bending operations.

Having thus described our invention it will be obvious that although various minor modifications might be suggested by those versed in the art, it should be understood that we wish to embody within the scope of the patent granted hereon all such modifications as reasonably and properly come within the scope of our contribution to the art.

We claim as our invention:

1. A simple, low-cost housing structure for a semiconductor component or integrated circuit, in particular for insertion thereof into a layer circuit arrangement or conductor board, comprising a metal base plate of good heat conductivity, forming the bottom of the structure, and having a bottom and a top face, and upon the top face of which the semiconductor component is disposed, the latter being provided with upwardly extending contact elements, plastic foil means provided with individual metal films disposed above and contacting the respective contact elements, said metal films extending from the respective contact elements laterally outward relative thereto, and then downwardly to the base plate, with each metal film being insulated from the base plate by a plastic film, the contacted semiconductor component, and adjacent side of the base plate being protected by a plastic mass covering the same, to rigidly maintain said base plate, semiconductor component and metal contacting films in assembled relation thereby forming a unitary structure insertible in a cooperable circuit arrangement or conductor board, with said metal films directly connectible thereto for effecting the electrical connection of said semiconductor component or integrated circuit.

2. A housing according to claim 1, wherein the base plate is formed of copper.

3. A housing according to claim 1, wherein the metal films are formed of tinned copper.

4. A housing according to claim 1 for insertion into a layer circuit, wherein the side of the base plate remote from the semiconductor is provided with a layer of tin.

5. A housing according to claim 1, wherein the base plate is provided with extensions forming cooling wings.

6. A housing according to claim 1 for insertion into a conductor plate, wherein the base plate is provided with at least one extension forming an electrical and/or mechanical connection terminal therefor.

7. A housing according to claim 1, wherein the base plate and the metal films are formed of tinned copper.

8. A housing according to claim 7 for insertion into a layer circuit, wherein the side of the base plate remote from the semiconductor is provided with a layer of tin.

9. A housing according to claim 8, wherein the base plate is provided with extensions forming cooling wings.

10. A housing according to claim 7 for insertion into a conductor plate, wherein the base plate is provided with at least one extension forming an electrical and/or mechanical connection terminal.

11. A housing according to claim 10, wherein the base plate is provided with extensions forming cooling wings.

* * * * *